United States Patent [19]

Werner et al.

[11] 4,348,753

[45] Sep. 7, 1982

[54] ELECTRO-MECHANICAL PULSE GENERATOR

[75] Inventors: Arnold Werner, Nuremberg; Peter Ennen, Allersberg; Josef Nuebauer, Grobschwarzenlohe; Hans Flaig, Schramberg; Juergen Allgaier, Lauterbach, all of Fed. Rep. of Germany

[73] Assignee: Firma D I E H L, Nuremberg, Fed. Rep. of Germany

[21] Appl. No.: 152,036

[22] Filed: May 21, 1980

Related U.S. Application Data

[63] Continuation of Ser. No. 861,444, Dec. 16, 1977, abandoned.

[30] Foreign Application Priority Data

Dec. 22, 1976 [DE] Fed. Rep. of Germany ....... 2658105

[51] Int. Cl.³ ........................ G04C 9/00; G04B 29/00; H03K 17/56

[52] U.S. Cl. .................................... 368/188; 368/321; 307/247 A; 328/87

[58] Field of Search .................... 368/69, 70, 185-189, 368/320-321; 200/11 G, 110, 110 A; 307/247 A; 328/87

[56] References Cited

U.S. PATENT DOCUMENTS

| | | | |
|---|---|---|---|
| 3,571,534 | 3/1971 | Ashman | 200/11 |
| 3,571,535 | 3/1971 | Beaver | 200/11 |
| 3,584,163 | 6/1971 | White | 200/11 |
| 3,621,162 | 11/1971 | Wall | 200/11 DA |
| 3,733,803 | 5/1973 | Hiraga et al. | 368/187 |
| 3,733,810 | 6/1973 | Hiraga et al. | 368/29 |
| 4,037,116 | 7/1977 | Hopama | 307/247 A |

*Primary Examiner*—Vit W. Miska

*Attorney, Agent, or Firm*—Burns, Doane, Swecker & Mathis

[57] ABSTRACT

An electro-mechanical pulse generator for producing electronic pulses to set or correct the readout of an electronic digital display. Two contact assemblies rotatable relative to one another cooperate to close at least two pairs of electric contact elements to produce at least two pulses. The pulses have a phase shift relative to one another which is dependent upon the direction of relative rotation of the contact assemblies and a frequency which is proportional to the speed of rotation. Control logic determines the phase shift of one pulse relative to another, i.e. lead or lag, and causes an UP-DOWN counter to produce an up-count or down-count accordingly.

18 Claims, 42 Drawing Figures

Fig. 1
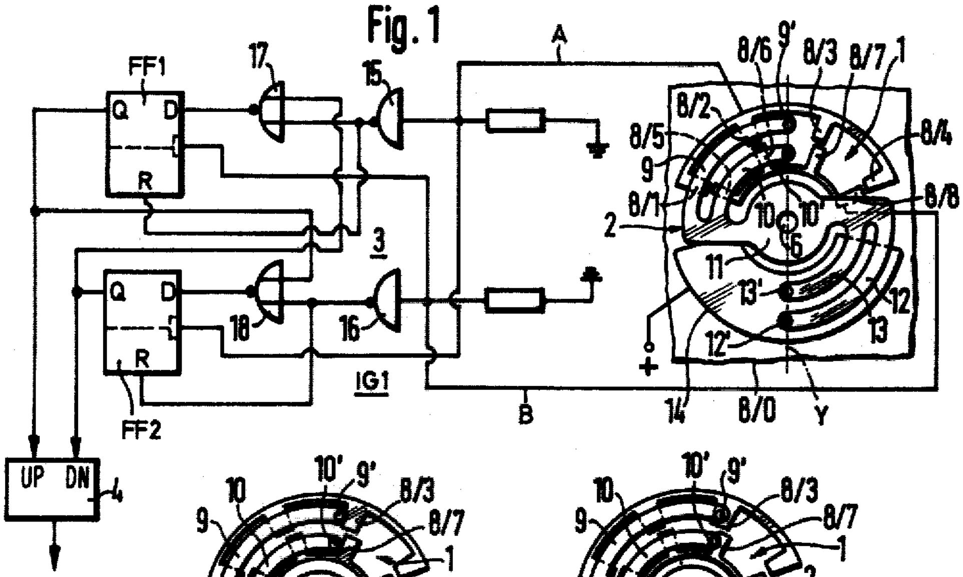
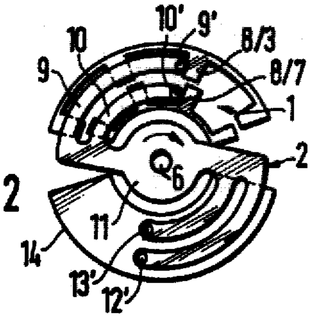
Fig. 2
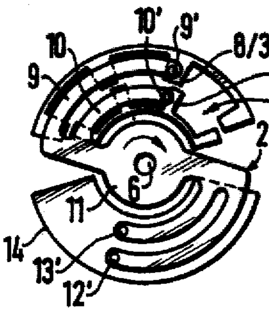
Fig. 3
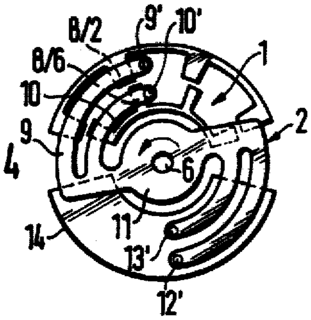
Fig. 4
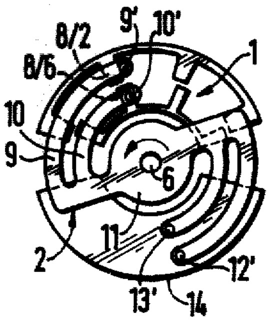
Fig. 5
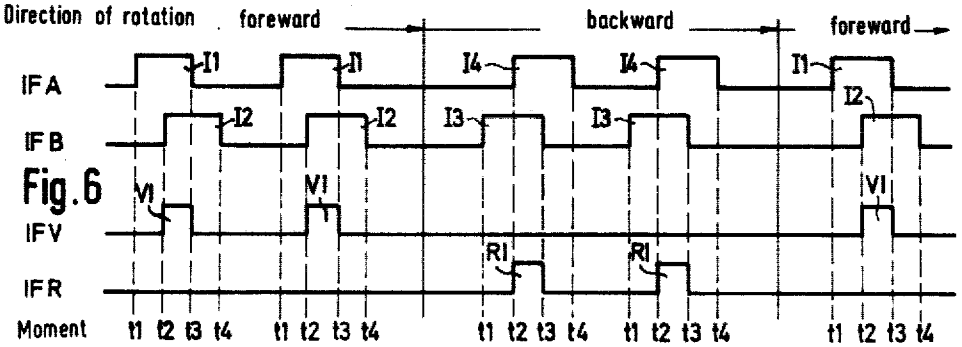
Fig. 6

Fig.11
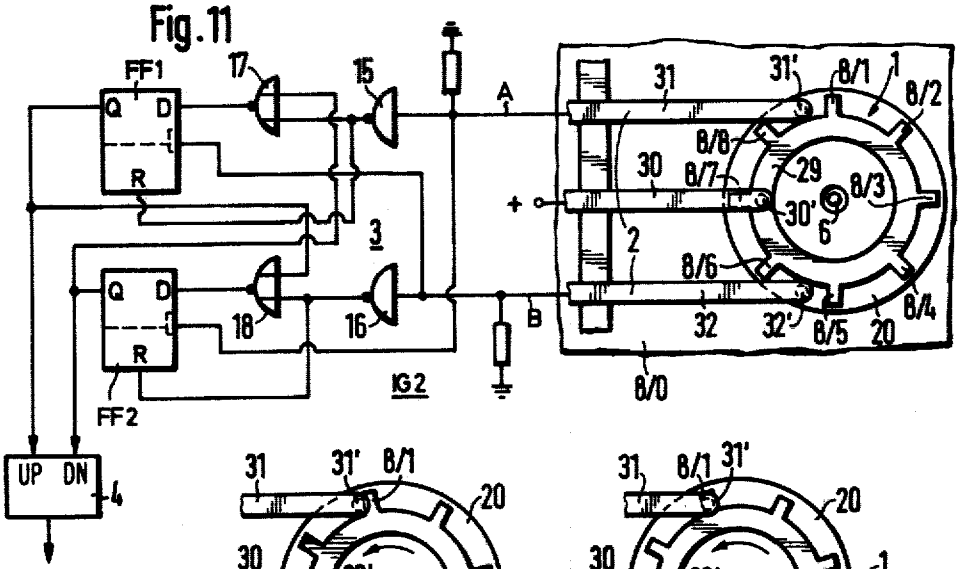
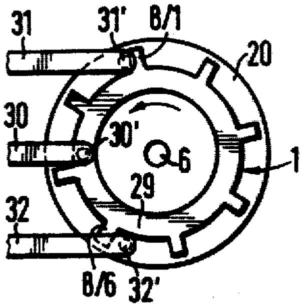
Fig.12
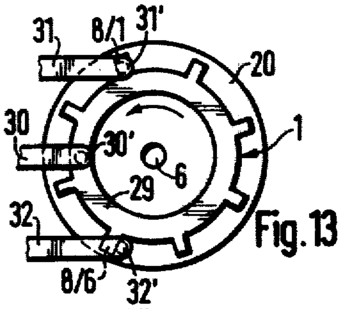
Fig.13
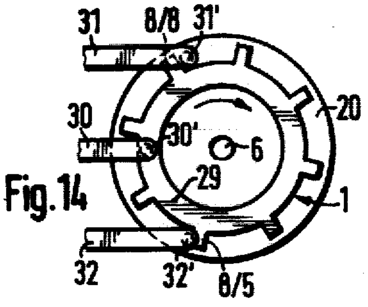
Fig.14
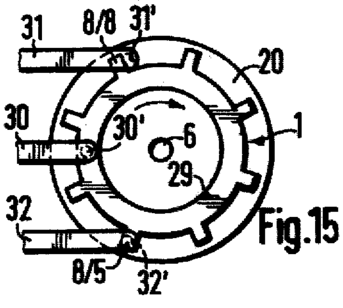
Fig.15
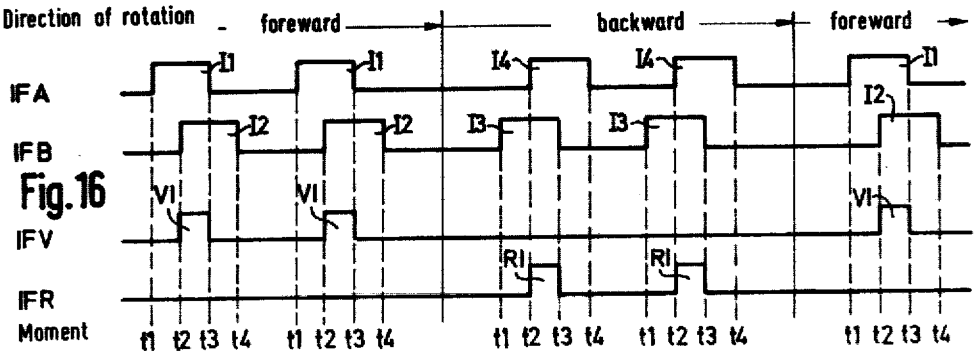
Fig.16

Fig. 31
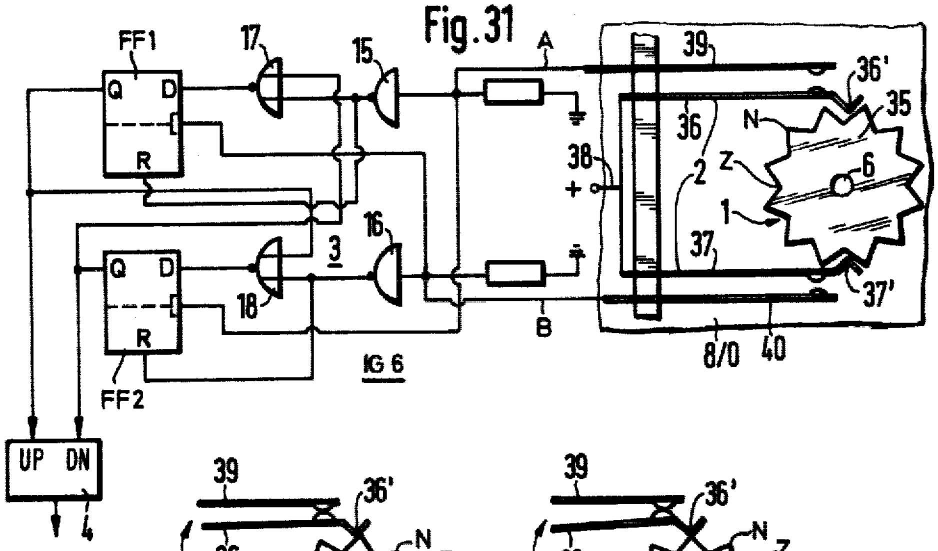
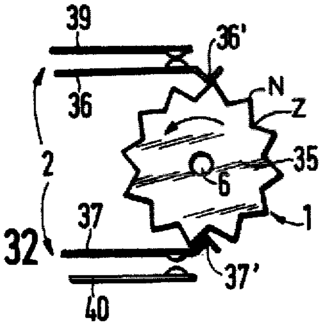
Fig. 32
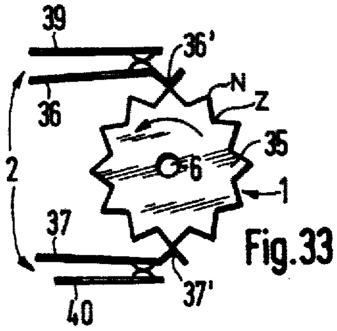
Fig. 33
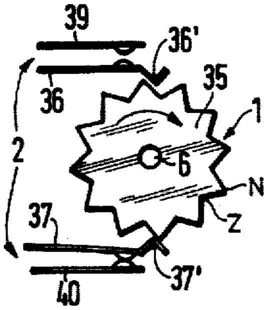
Fig. 34
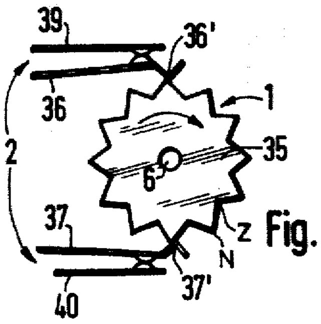
Fig. 35
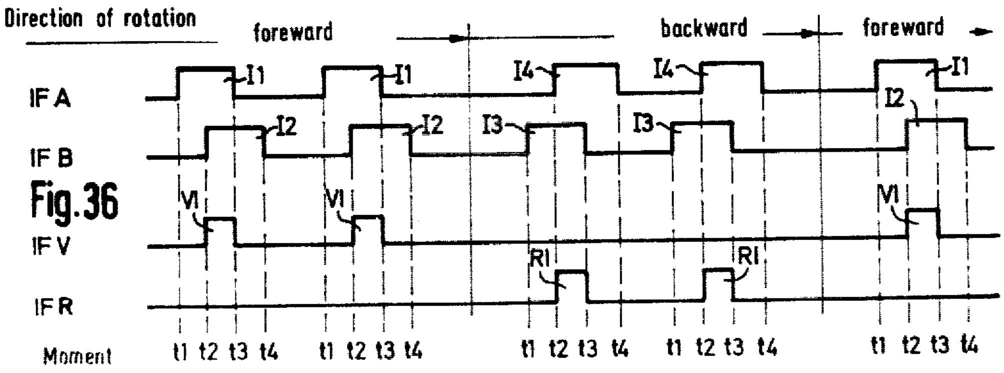
Fig. 36

Fig. 37
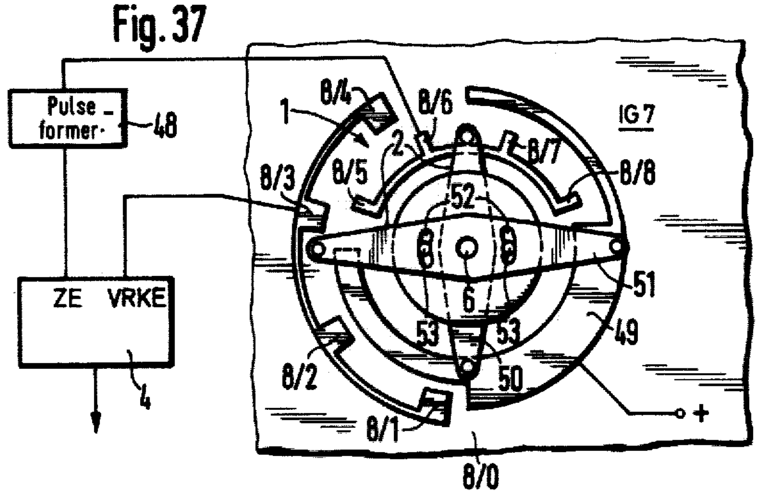
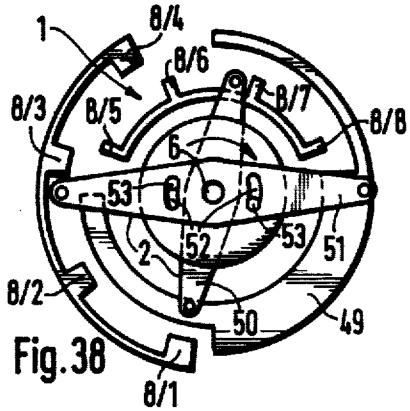
Fig. 38
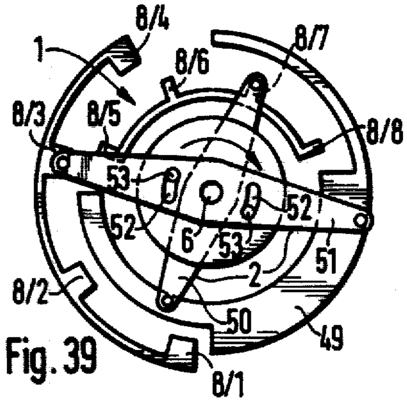
Fig. 39
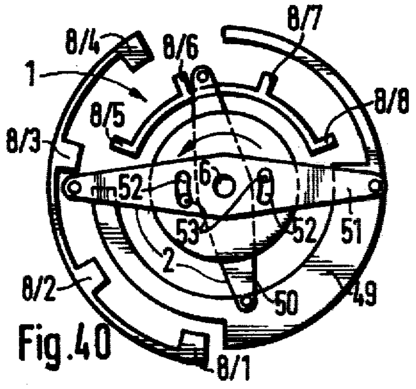
Fig. 40
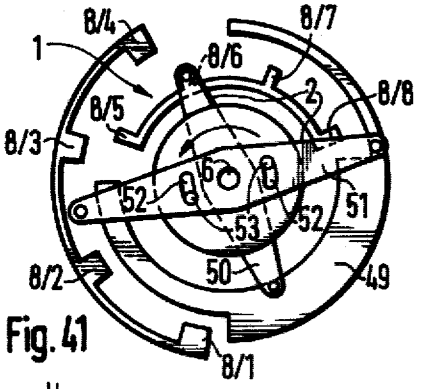
Fig. 41
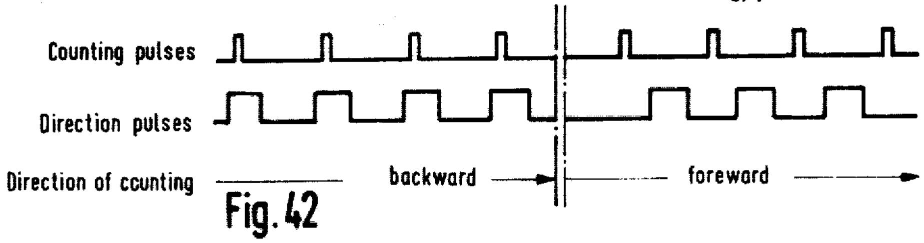
Fig. 42

ELECTRO-MECHANICAL PULSE GENERATOR

This is a continuation of application Ser. No. 861,444, filed Dec. 16, 1977, now abandoned.

BACKGROUND OF THE INVENTION

The invention concerns an electro-mechanical pulse generator for producing electric pulses for setting, or alternatively correcting, an electronic digital display.

Swiss Pat. No. 558,560 discloses a device for setting an electronic digital display in an electronic clock or watch where the correction or setting of the display is accomplished by a control knob located on the exterior of the clock casing. By turning this knob it becomes possible to select by way of a contact spring, arranged at the stem of the knob, various output signals from a frequency divider located inside the clock. This causes pulses possessing various high frequencies to be fed into the electronic digital display, thus correcting their associated portions of the display by means of various preset pulse frequencies, as required. As an additional improvement of this device there is provided a separate RC or LC oscillator, likewise adjustable from the outside by a control knob, wherein the frequency of the correcting pulses fed into the digital display can be varied linearly in functional relation to the angle of twist of the control knob. For both species of the described display-setting device, there are further provided means which allow the display to be set either forward or backward.

The devices described require a very delicate handling by the person operating the outside control knob because the frequency divider output signals to be engaged are located very close to each other and because only a relatively limited angle of twist is available. Neither of these regulating devices, designed to correct the electronic digital display of a clock or watch, teach or suggest the solution of the problem with which the present invention is concerned.

Applicant's German Pat. No. 2,540,486 discloses an electronic clock with an electro-mechanical adjusting device for setting or correcting the electronic digital display wherein the previously described disadvantages are avoided. The adjustment of the display differs from the arrangement disclosed by the Swiss patent, by the use of individual impulses, produced by a pulse generator, whose frequency as well as direction are readily variable in a functional relation to the operational speed and direction of a control unit.

It is therefore an object of the present invention, to provide a display-regulating device which is inexpensive and suitable for series production by simplification of the mechanical and the electrical structure.

It is a further object of the present invention to provide a display regulating device which is not limited in its use to specific types of instruments with electronic digital display, and which allows the production of pulses in either direction, i.e. forwardly or rearwardly by simple electronic means.

The electro-mechanical pulse generator provided by the present invention is simple and easy to manipulate, making it possible to set very rapidly an electronic digital display at a desired value. Any errors in setting the display can be easily corrected because the device provided by the present invention permits a forward as well as a rearward direction of correction. The setting of a display value is accomplished by individual pulses which can be generated either slowly or in rapid succession in dependence upon the turning speed of a control element. This permits the direction of the correction produced by pulses—either forward or backward—to be clearly defined and therefore easily controlled by control logic. The pulses are fed into an UP-DOWN counter to actuate the unit specifically in forward or rearward direction.

Depending on the number of pulse-generating elements of a pulse generator and the gear ratio between the control element and pulse generator, or collector, it will be possible to produce, for example, 60 pulses per one turn of the actuating element. The person setting the display is not restricted by fixed correcting positions to be arrived at by a turn of the control element or by a correcting speed to be accomplished on the basis of feel and experience. There is assigned to each individual, adjustable display value a mechanical angular momentum which is noticeable at the control element by means of a lock-in of the pulse generator, or pulse collector.

BRIEF DESCRIPTION OF THE DRAWINGS

The invention will now be described in detail on the basis of several preferred embodiments illustrated by the drawings wherein:

FIG. 1 is a schematic diagram of a first embodiment of a pulse generator in accordance with the present invention;

FIGS. 2 and 3 illustrate the rotor, rotated into different angular positions relative to the stator of the pulse generator for the purpose of producing a forward impulse (direction of rotation indicated by arrow);

FIGS. 4 and 5 illustrate the rotor, rotated into different angular positions relative to the stator of the pulse generator for the purpose of producing a backward impulse;

FIG. 6 is a pulse diagram, illustrating the input and output pulses which can be produced by the pulse generator illustrated in FIG. 1;

FIG. 11 is a schematic diagram of another embodiment of a pulse generator;

FIGS. 12 and 13 illustrate the rotor, rotated into different angluar positions relative to the stator of the pulse generator illustrated in FIG. 11 for the purpose of producing a forward impulse;

FIGS. 14 and 15 illustrate the rotor rotated into different angular positions relative to the stator of the pulse generator illustrated in FIG. 11 for the purpose of producing a backward impulse;

FIG. 16 is a pulse diagram, illustrating the input and output pulses which can be produced by the pulse generator shown in FIG. 11;

FIG. 31 is a schematic diagram of a sixth embodiment of a pulse generator;

FIGS. 32 and 33 illustrate rotor, rotated into different angular positions relative to the stator of the pulse generator illustrated in FIG. 31 for the purpose of producing a forward impulse;

FIGS. 34 and 35 illustrate the rotor, rotated into different angular positions relative to the stator of the pulse generator illustrated in FIG. 31 for the purpose of producing a backward impulse;

FIG. 36 is a pulse diagram, illustrating the input and output pulses which can be produced by the pulse generator illustrated in FIG. 31;

FIG. 37 is a schematic diagram of a seventh embodiment of a pulse generator;

FIGS. 38 and 39 illustrate the rotor, rotated into different angular positions relative to the stator of the pulse generator illustrated in FIG. 37 for the purpose of producing a backward impulse;

FIGS. 40 and 41 illustrate the rotor, rotated into different positions relative to the stator of the pulse generator illustrated in FIG. 37, for the purpose of producing a forward impulse; and FIG. 42 is a pulse diagram, illustrating the pulses which can be produced when the pulse generator illustrated in FIG. 37 is actuated.

DETAILED DESCRIPTION

Figure 7:
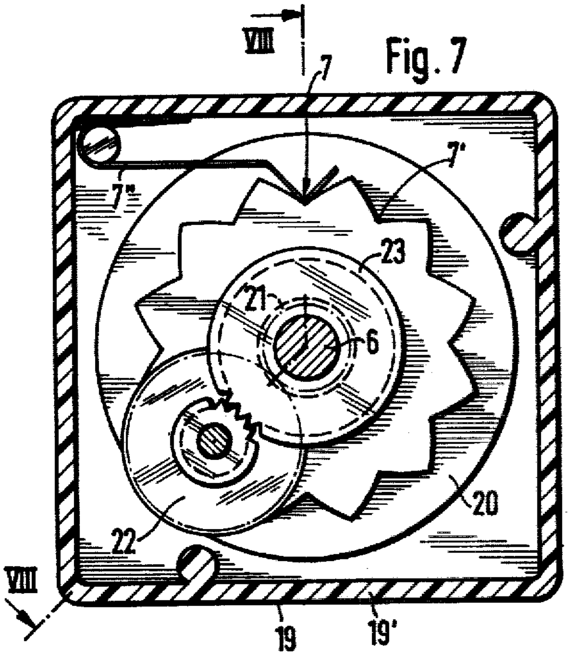
FIG. 7 is a sectional view of the pulse generator taken along the line VII—VII shown in FIG. 8.

Components which are identical or similar are denoted by like reference numerals in the different figures.

The electro-mechanical pulse generators which are illustrated in the figures, only schematically in some instances, consist generally of a first contact assembly, or stator, 1, a second contact assembly, or rotor, 2, a control logic 3, an UP-DOWN counter 4, a manually movable control element 5 (FIG. 8), an axle of rotation 6 which is turned when said element 5 is actuated, and a catch wheel 7.

The pulse stator 1 consists of several pulse-generating elements 8 which are arranged over a circular track concentric with the axle of rotation 6. These elements interact with several sensing elements, which are united on the rotor 2, with the sensing elements being formed by electrical contact elements. When the pulse generator is to be actuated, the components of the stator 1 and of the rotor 2 can be turned relative to each other by means of the control element 5 at various speeds and in a desired direction to generate pulses. The frequency of the pulses which can be produced is proportional to the relative speed between the components of the stator 1 and the rotor 2.

When the pulse generator is being operated in the above-described manner, the pulse-generating components of the stator 1 and the contact elements of the rotor 2 can close two pairs of electrical contacts independently of each other. The pulse-generating components of the stator 1 and the sensing elements of the rotor 2 are angularly staggered relative to each other around the axle of rotation 6. Thus, upon the actuation of the pulse generator, pulses can be produced which are displaced in time relative to each other. The type of phase shift of the pulses—phase lead or lag, respectively—depends on the direction of rotation. The phase difference is detected by the control logic 3, and the UP-DOWN counter 4 is advanced in a clearly defined manner by a forward or a backward impulse.

The circuit components of the control logic 3 serve, in addition to the detection of direction, for the suppression of contact bounce by the pulses which can be produced when a pair of contacts are being closed.

Two contact sections, each formed by a component of the stator 1 and a component of the rotor 2, are arranged spatially as well as functionally within one switching section which is connected by one contact element with a voltage source and by the other contact element to an input of the UP-DOWN counter 4 by way of the control logic 3.

In order to simplify the circuit layout, the switching sections are preferably connected by way of a central wire to a terminal of a voltage source which is not illustrated in the figures. The above described design of the pulse generator provided by the present invention is applicable to all species which are described hereinafter, and identical reference numerals are therefore used in all figures for the components of the pulse generator.

The stator 1 of the pulse generator IG1 illustrated in FIG. 1 consists of two groups of four contact surfaces each, 8/1 to 8/4 and 8/5 to 8/8, respectively. They are arranged on a support plate 8/0 made of insulating material within two circular tracks of different diameters and concentric with the axle of rotation 6, to form the pulse-generating elements. The first group of contact surfaces 8/1 to 8/4 is arranged within an outer circular track, and the second group of contact surfaces 8/5 to 8/8 within an inner circular track. The contact surfaces of each group are conductively connected, by means of a central wire A or B, respectively, with each other and with the control logic 3. Each of the contact surfaces 8/1 to 8/4 of the first group is laterally offset from the radially adjacent contact surface of the second group of contact surfaces 8/5 to 8/8 by approximately $\frac{1}{3}$ of a contact surface width.

The rotor 2 of the pulse generator IG1 is equipped with two spring contacts 9 and 10 which can move relative to the fixedly arranged contact surfaces of the stator 1. The two spring contacts 9 and 10 have the shape of curved leaf springs and are molded to an electrically conductive central part 11 which is connected to the drive of the pulse generator in a manner that will be explained below. The two spring contacts 9 and 10 are located with their outer free ends 9' and 10' at an assumed straight line Y, passing through the center of the axle of rotation 6 and engage with these free ends the two circular tracks of the contact surfaces of the stator 1.

The rotor is also equipped with two spring contacts 12 and 13, again in the shape of leaf springs, designed in the same manner as the two other leaf springs, 9, 10, offset relative to the former by 180° at rotational symmetry and molded to the central part 11. Finally, there is provided a contact plate 14, shaped in the form of a sector of an annulus and connected with the voltage source (not shown) upon which rests one of the two pairs of leaf springs. The outer free ends 9' and 10' of the two spring contacts 9 and 10 form with one of the contact surfaces 8/1 to 8/4 of the outer circular track and 8/5 to 8/8 of the inner circular track two pairs of contacts which, upon the actuation of the pulse generator, due to the geometrically offset arrangement of the contact surfaces of the stator 1, can be closed successively to produce pulses which are displaced timewise but will partially overlap each other.

The pulses produced by means of the spring contacts 9, 10, the central part 11, the spring contacts 12, 13 and the contact plate 14, are fed to a forward input UP or respectively a backward input DN of the UP-DOWN counter 4 by way of connecting lines A, B and the control logic 3. This control logic consists of two bistable Eccles-Jordan circuits, namely a first flip-flop FF1 and a second flip-flop FF2, interlinked with each other by a logical circuit which includes inverters 15, 16 and NOR-gates 17, 18. A contact section, an inverter, a NOR-gate and a flip-flop each comprise one of two switching sections. The four logical gates 15 to 18 serve to actuate the two flip-flop units FF1 and FF2 and to suppress the bouncing effect.

The operation of the pulse generator IG1, shown in FIG. 1, will now be explained in detail with reference to FIGS. 2 to 6. When the pulse generator IG1 is actuated in one direction to produce forward inpulses (in the direction shown by arrows—FIGS. 2 and 3), the rotor 2 is turned away from a latched position shown in FIG. 1. The outer ends 9' and 10' of the two spring contacts 9 and 10 of the rotor 2, co-acting with the laterally offset contact areas 8/3 and 8/6 which are located in the path of the turn, will cause the two pairs of contacts to close in succession at time intervals, namely the outer pair of contacts at the instant of time t1 (FIG. 2) and the inner contact section at the instant t2 (FIG. 3). When the pulse collector is turned further (not illustrated) up to the instant of time t3, the first pair of contacts begins to open. At the instant t4 the outer end 9' of the spring contact 9 has left the contact surface 8/3, and at this instant the outer end 10' of the spring contact 10 is leaving the contactsurface 8/6 of the stator 1, so that both pairs of contacts will again be open after the instant of time t4.

The electrical pulses which can be produced by the above-described operation and by other similar operations are depicted in FIG. 6. The pulse sequence IFA depicts the input pulses which are being fed into the control logic by way of the connecti ng line A. The pulse sequence IFB depicts the input pulses which reach the control logic by way of the connecting line B. The pulse sequence IFV depicts the pulses which leave the control logic and are being fed into the forward input UP of the UP-DOWN counter 4. The pulse sequence IFR shows the pulses which leave the control logic and which can be fed into the UP-DOWN counter 4 through the backward input ON. The pulse sequences IFV and IFR result from the layout of the control logic, especially from the logical interlink of the two flip-flop units FF1 and FF2.

At the instant of time t1, that is at the closing of the first pair of contacts, a "high" signal is placed across the input D of the first flip-flop FF1 by the pulse I1 produced thereby. At the instant of time t1, that is at the closing of the second contact section, the leading edge of the second pulse I2 produced thereby will activate the flip-flop FF1 and the pulse being present there is advanced as forward pulse VI to the forward input UP of the UP-DOWN counter 4. At the instant t3, that is when the first contact section opens, the flip-flop FF1 will be reset.

The switching section leading to the backward input DN of the UP-DOWN counter 4 remains blocked during the above-described process because the second flip-flop FF2 does not receive an activating signal.

When the pulse generater IG1 is actuated for the purpose of producing backward pulses, the rotor 2 is turned from the latched position as shown in FIG. 1 relative to the pulse-producing elements of the stator 1 in the direction indicated by arrows in FIGS. 4 and 5, whereby the two pairs of contacts are again closed in succession at time intervals (see FIG. 6, backward direction of rotation). At the instant of time t1 the inner pair of contacts is closed, with the outer end 10' of the spring contact 10 of the rotor 2 touching the contact surface 8/6 of the stator 1 (FIG. 4), and an impulse I3 is produced. At the instant of time t2 the outer pair of contacts is then closed, with the outer end 9' of the spring contact 9 of the rotor 2 touching the contact surface 8/2 of the stator 1 (FIG. 5), an another impulse I4 is generated. If the rotor is turned further, the two contact sections will initially remain closed but will then open again at time intervals in succession. The phase relation of the two pulses I3 and I4 is handled again by the control logic 3.

A high-signal is placed across the input D of the second flip-flop FF2 by the impulse I3. The leading edge of the impulse I4 activates the second flip-flop FF2, and the pulse present there is advanced as backward pulse T1 to the backward input DN of the UP-DOWN counter 4. The flip-flop FF2 is subsequently, that is upon the opening of the inner contact section, reset. The first flip-flop remains blocked during this process because it does not receive an activating signal so that pulses can not reach the forward input UP of the UP-DOWN counter 4.

The above-described processes for the generation of forward or backward pulses will recur in identical manner whenever pairs of contacts are closed or opened. In case of this species of the pulse generator, the two pairs of contacts can be closed eight times during one full turn of the rotor 2.

Figure 8:
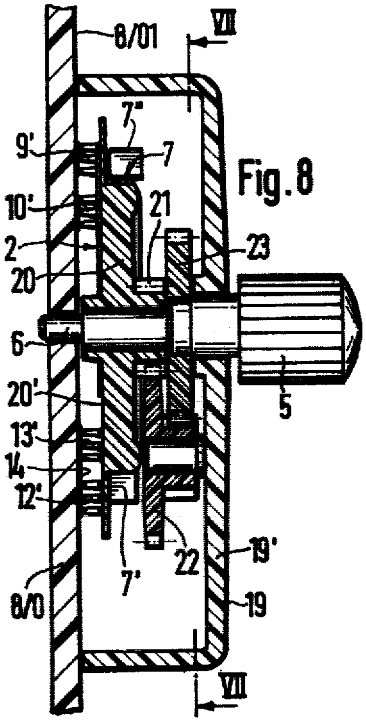
FIG. 8 is a longitudinal cross-sectional view of the generator illustrated in FIG. 7 taken along the line VIII—VIII shown in FIG. 7.

FIGS. 7 and 8 depict the total physical layout of the pulse generator shown in FIG. 1. The mechanical components are placed inside a housing 19 which consists of a supporting plate 8/0 and a covering hood 19' and which is traversed by the axle of rotation 6. The latter is turnably mounted in bores of the supporting plate 8/0 and of the covering hood 19'. Exterior to, and at the housing 19 there is arranged the control element 5, a knob in case of the specie illustrated. The axle of rotation 7 supports inside the housing a drive wheel 20, made of insulating material, in such manner that it can turn easily, with the rotor 2, described above in detail in connection with FIG. 1, fastened to its bottom 20'.

FIG. 8 shows that the outer ends 9' and 10' as well as 12' and 13' of the respective spring contacts 9, 10 and 12, 13 have, for the puspose of insuring proper pulse generation, a forked shape and are bent downward toward the supporting plate 8/0, its internal surface 8/01 carrying the contact surfaces of the stator 1 and the contact plate 14. The drive wheel 20 is equipped with a click-stop serration 7' which form together with a catching spring 77" the above mentioned catch wheel 7 which makes it possible to set and lock the components of the rotor in a position between two adjacent contact surfaces of the stator 1 when the pulse generator is not being actuated, as shown in FIG. 1. To the drive wheel 20 there is finally attached a pinion 21 which forms, together with two other toothed gears 22 and 23, a gear transmission which makes possible the production of 60 to 90 pulse per full turn of the control element 5, depending on the gear ratio used.

Figure 9:
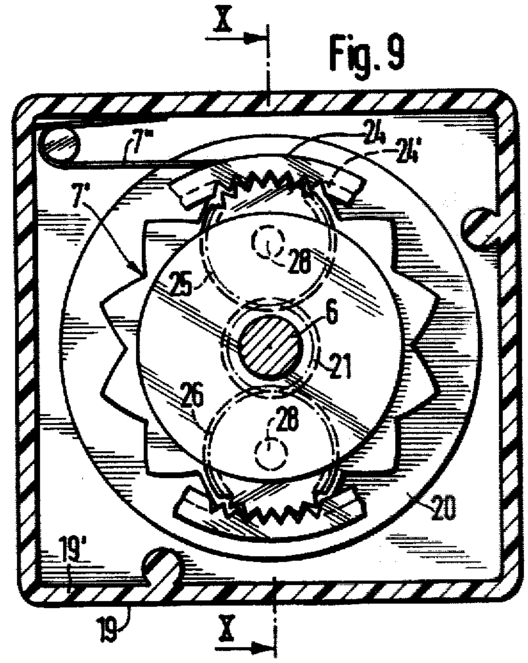
FIG. 9 illustrates a different embodiment of the drive mechanism of the pulses generator shown in FIGS. 7 and 8 in a sectional view taken along line IX—IX indicated in FIG. 10.
Figure 10:
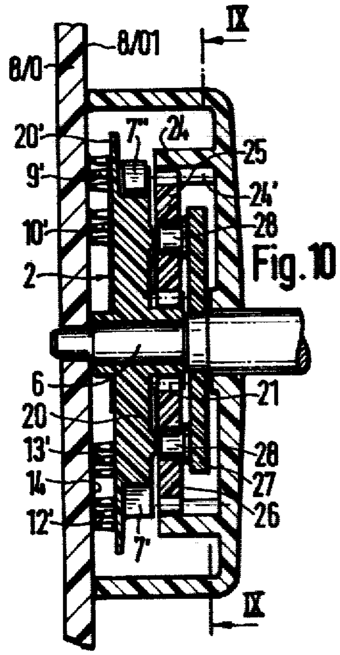
FIG. 10 illustrates a longitudinal cross-sectional view of the pulse generator illustrated in FIG. 9 taken along the line X—X shown in FIG. 9.

FIGS. 9 and 10 show a layout which is similar to the layout of the pulse generator depicted in FIGS. 7 and 8. However, the plain gear transmission is now replaced by an epicyclic gear, comprisiang a spurwheel 24 with internal gearing 24', attached to the covering hood 19' of the housing 19. Two planetary pinions 25 and 26 engage the internal gearing 24' of the wheel 24 and the pinion 21 at the drive wheel 20. The two planetary pinions 25 and 26 are rotatably mounted, each by one bearing bolt 28, at a carrier plate 27 which is fixedly fastened to the axle of rotation 6. The axle of rotation 6 which in case of this specific arrangement also forms the central axle of the epicyclic gear, can be operated either by a control knob (FIG. 8) or a servo-motor with a variable speed.

The connecting lines A and B and the connection to the voltage source are conducted from the housing 19 through the supporting plate 8/0 in a manner not illustrated, for example in the form of plugs and sockets. The control logic 3 and the UP-DOWN counter 4 can thus be attached to the outside of the hosing 19 and kept away from the mechanical part of the system. However, these electronic components can also readily be placed inside the housing 19 if desired.

FIG. 11 depicts a second species of a pulse generator, denoted by symbol IG, in diagram form which differs from the species illustrated by FIG. 1 in the design of the stator 1 and the rotor 2. The general layout of this pulse generator IG2 is very similar to the arrangements depicted by the FIGS. 7 and 8 or 9 and 10 respectively, and is therefore not shown again.

In place of the rotor design illustrated in FIG. 1 there is now arranged the pulse-producing contact surfaces 8/1/ to 8/8 in a circular track, concentric with to the axle of rotation 6, at the bottom 20' of the drive wheel 20 which forms the supporting plate. The contact surfaces 8/1 to 8/8 are molded radially to the outside of an electrically conductive slip ring 29, onto which rests the outer free end 30' of a contact spring 30, its other end clamped down and connected to the positive pole of a voltage source.

The sensor elements of the stator 2 are formed in case of this species by two spring contacts 31 and 32, with the first spring contact 31 connected by line A, and the second spring contact 32 connected by line B with the control logic 3 which has the same layout as the control logic 3 shown in FIG. 1. Both spring contacts 31 and 32 are designed in the form of leaf springs which are clamped on one side, are arranged parallel to each other and engage by means of their outer free ends 31' and 32' respectively, which are spatially offset relative to each other, the circular track of the contact surfaces 8/1 to 8/8 of the rotor 1. Two pairs of contacts, upon actuation of the pulse generator IG2 in a direction of rotation, can be closed successively to produce pulses which are displaced timewise but will partially overlap each other.

FIGS. 12 and 13 depict two positions of the rotor 1, turned relative to the stator 2 as indicated by arrows for the generation of forward pulses. Upon the actuation of the pulse generator IG2, the first pair of contacts comprised of the first contact area 8/1 and the outer end 31' of the spring contact 31 (FIG. 12) and then the second pair of contacts formed by the contact surface 8/6 and the outer end 32' of the spring contact 32 (FIG. 13) are closed. When the rotor 1 is turned further, the two pairs of contacts will remain closed termporarily until they re-open is succession.

FIGS. 14 and 15 likewise depict two positions of the rotor 1, turned to the stator 2, in the direction shown by arrows for the generation of backward pulses. Upon actuation of the pulse generator a first pair of contacts formed by the contact surface 8/5 and the outer end 32' of the spring contact 32 (FIG. 14), and thereafter a second pair of contacts formed by the contact surface 8/8 and the outer end 31' of the spring contact 31 are closed. When the rotor 1 is turned further, the two contact sections will temporarily remain closed, and will then re-open in succession.

The pulses which can be generated in forward and backward direction of rotation are in principle identical with the pulses of thepulse generator shown by FIG. 1, and the pulse diagram of FIG. 6 is applicable to the species presently discussed. However, for reasons of clarity this graph is shown again in FIG. 16.

Figure 17:
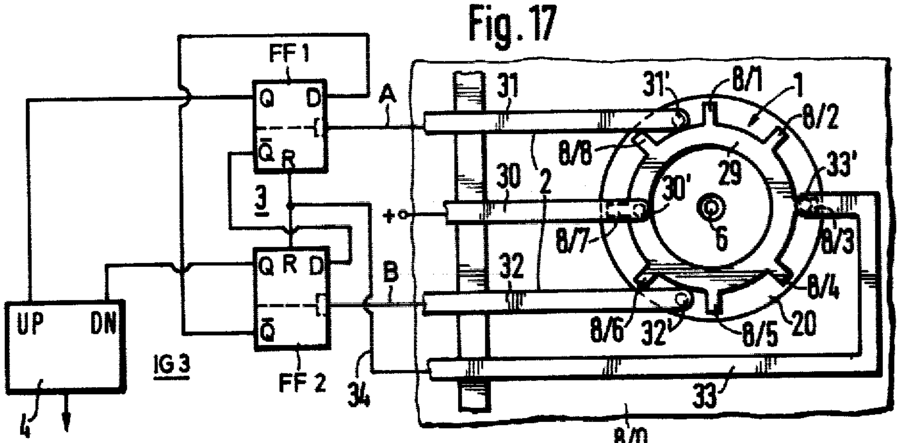
FIG. 17 illustrates a third embodiment of the pulse generator.

FIG. 17 depicts a third species of a pulse generator IG3. It is identical to a large extent with the pulse generator IG2 shown by FIG. 11, and for this reason only the distinguishing features, resulting from a simplified layout of the control logic 3, will be discussed. The control logic 3 of this pulse generator IG3 consists solely of the two flip-flop units FF1 and FF2, again interlinked logically with each other but without the use of the four logical gates 15 to 18. The complementary output $\overline{Q}$ of each of the two flip-flop units FF1 and FF2 are fed back to the input D of the other flip-flop unit. The logical gates 15 to 18 are replaced by a mechanical reset contact 33 which is connected by way of a wire 34 to reset inputs R of the two flip-flop units FF1 and FF2. The reset contact 33 is designed in the form of a leaf spring, clamped down on one side and engaging with its outer free end 33' the circular track of the contact surfaces 8/1 to 8/8 of the rotor 1, in cooperation with the contact surface involved in each given case in such manner that the two flip-flop units can be reset when the pairs of pulse producing contacts are open. One such specific reset position is depicted in FIG. 17 where the reset contacts are closed between the outer end 33' of the reset contact 33 and one of the contact surfaces 8/1 to 8/8. This reset position illustrated coincides with a latched position of the drive wheel 20.

The functional positions of the rotor 1 depicted in FIGS. 18 to 21 correspond to the respective positions shown by FIGS. 12 to 15, but the FIGS. 18 to 21 illustrate also the position of the reset contact 33 relative to the contact surfaces of the rotor 1.

Figure 18:
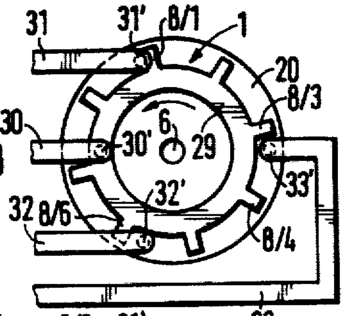
FIGS. 18 and 19 illustrate the rotor, rotated into different angular positions relative to the stator of the pulse generator illustrated in FIG. 17 for the purpose of producing a forward impulse.
Figure 19:
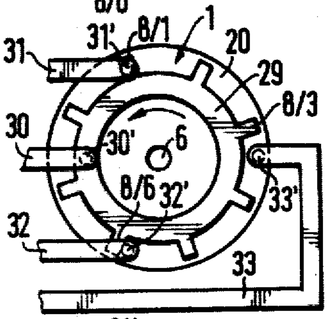
Figure 20:
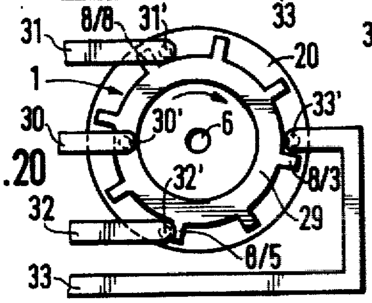
FIGS. 20 and 21 illustrate the rotor, rotated into different angular positions relative to the stator of the pulse generator illustrated in FIG. 17 for the purpose of producing a backward impulse.
Figure 21:
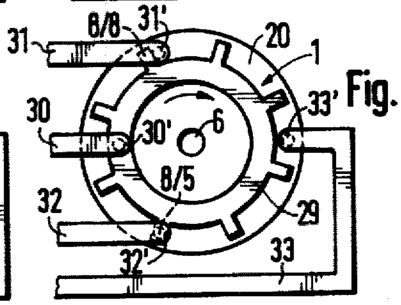
Figure 22:
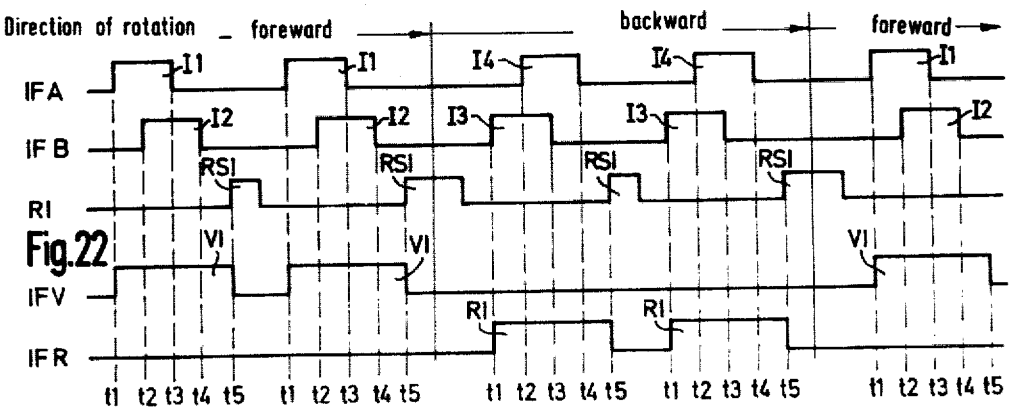
FIG. 22 is a pulse diagram, illustrating the input and output pulses which can be produced by the pulse generator illustrated in FIG. 17.

The modified control logic 3 results in pulses depicted in the diagram of FIG. 22, differing in some respects from the pulse diagram of FIG. 16. The changes concern only the pulse sequences IFV and IFR while the pulse sequences IFA and IFB are identical with the sequences shown in FIG. 16. The symbol RI denotes a reset pulse sequence, with the reset pulses RSI, which can be produced at each closing of a reset contact-section, being plotted. At the closing of the first pair of contacts (direction of rotation: FIG. 22 forward; direction of arrows; FIGS. 18 and 19), at the instant of time t1 there is produced a first impulse I1 which will reach by way of connecting line A and the clock input the fip-flop unit FF1, thereby setting the unit and advancing the pulse present there as forward pulse VI to the forward input UP of the UP-DOWN counter 4. The second impulse I2, produced by the time-delayed closing of the second pair of contacts will have no effect because at the instant t2 a low-signal exists across the input D of the flip-flop unit FF2 and the unit can therefore not be set. The opening of the two pair of contacts at the instants t3 and t4 has no influence on the modulated pulse because the flip-flop unit FF1 is still set. Its resetting is accomplished upon the closing of the reset contacts at the instant of time t5, with the leading edge of a reset impulse RSI marking the end of the traveling impulse VI.

When a backward pulse is generated (in arrow direction shown in FIGS. 20 and 21; direcction of rotation backward FIG. 22), a pulse I3 is produced upon the closing of the first pair of contacts at instant of time t1 which reaches the flip-flop unit FF' by way of the connecting line B and the clock input, thereby setting the unit and advancing the pulse present there as backward pulse RI to the backward input DN of the UP-DOWN counter 4. The second pulse I4, produced by the closing of the second pair of contacts at the instant of time t2, will again have no effect because a low-signal exists now across the input of the first flip-flop unit FF1 and the unit can therefore not be set. The opening of the two pairs of contacts at the instants t3 and t4 will have no influence on the pulse either because the flip-flop unit FF2 will be reset only at the instant t5 upon the closing of the reset contacts by the thereby produced reset pulse RSI, its leading edge marking the end of the traveling impulse RI.

The outer ends 31' and 32' of the two spring contacts 31 and 32 of the stator 2 can also engage the circular track of the contact surfaces 8/1 to 8/8 of the rotor 1 in such a manner that upon the actuation of the pulse generator pulses can be produced by the successive closing of the two contact sections which are offset timewise but do not overlap each other.

Figure 23:
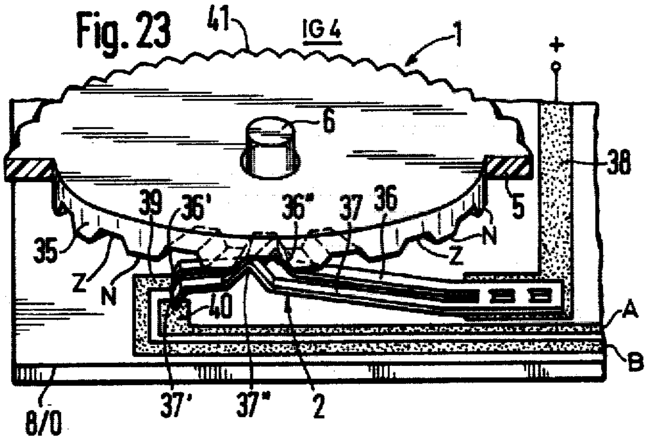
FIG. 23 is a schematic diagram of a fourth embodiment of a pulse generator.

FIG. 23 shows a fourth species of a pulse generator, denoted by the symbol IG4. Its rotor 1 differs from the previously shown embodiments in that it is designed in the form of a cam plate 35, made of insulative material, which is mounted at the axle of rotation 6 and is equipped with a plurality of mechanical contact cams N, arranged concentrically to the axle of rotation 6 along a circular track at uniform spacings with gaps Z. The stator consists of two spring contacts 36 and 37, formed by two springs in the shape of a leaf which are clamped down on one side. These spring contacts extend parallel to each other and are fastened at the supporting plate 8/0 and are both connected to the positive terminal of the voltage source.

Figure 28:
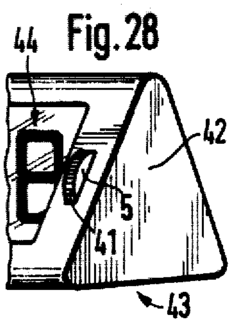
FIG. 28 illustrates the placement of the control unit of the pulse generator illustrated in FIG. 23 within an instrument with an electronic digital display.

The outer free ends 36' and 37' of the two spring contacts 36 and 37 to are bent toward the supporting plate 8/0 and act, together with opposite contacts 39 and 40 arranged in the form of contact surfaces at the supporting plate 8/0 and connected by the two wires A and B to the control logic 3, to form the two pairs of contacts. Control logic 3 is identical with the unit shown in FIG. 1 and is not illustrated here. The two spring contacts are provided also with projections 36" and 37" respectivey, bent in V-shaped and spatially offset relative to each other, engaging one of the gaps Z between two contact cams N (FIG. 24) so that they can be deflected by one of the cams N and pressed against the opposite contacts 39 and 40 respectively in succession and with time-delay upon the actuation of the pulse generator IG4. The cam plate 35 is further provided with a knurled edge 41 to facilitate its handling and protrudes, in the manner shown by FIG. 28, from the casing 42 of an instrument 43 with electronic digital display 44.

Figure 24:
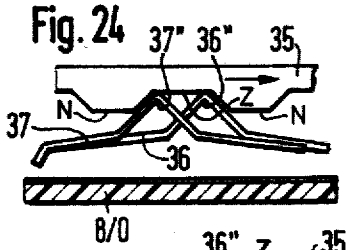
FIGS. 24 to 27 illustrate in the form of an enlarged side view the course of movement between the components of the rotor and stator when the pulse generator illustrated in FIG. 23 is actuated.
Figure 25:
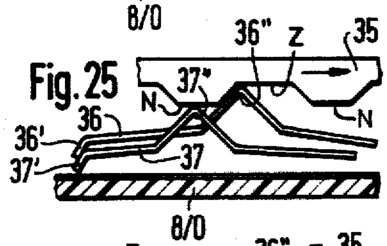
Figure 26:
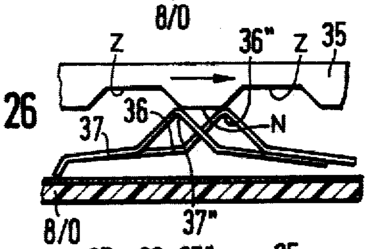
Figure 27:
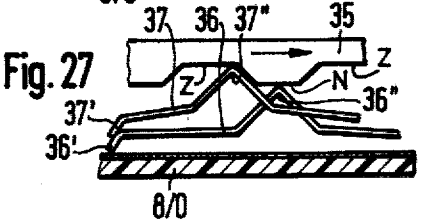

The cam N and their gaps Z, together with the two projections 36" and 37" of the spring contacts 36 and 37 provide the additional function of a click-stop device. FIG. 24 shows one such latched position. In the FIGS. 25 to 27 there are depicted three consecutive positions of the two spring contacts 36 and 37, with the cam plate 35 moved in the direction shown by arrows for the purpose of generating forward pulses. In FIG. 25 the spring contact 37 is deflected by a cam N, thereby closing the pair of contacts. A first pulse I1 is generated and reaches the control logic by way of the connecting line A. In FIG. 26 the second spring contact 36 is also diverted by this cam N and the second pair of contacts are now closed. A second impulse I2 is thus generated, and it reaches the control logic by way of the connecting line B. In FIG. 27 the first pair of contacts are opened again while the second pair of contacts are still closed. The next position, that is the latched position, is not illustrated because the position of the spring contacts is identical with the position shown in FIG. 24.

The generation of backward pulses is not illustrated because it involves only a change in the sequence of the diversion of the spring contacts 36 and 37 respectively, and thus in the closing of the two pairs of contacts. The pulse diagram depicted in FIG. 7 is applicable in this case because the pulse generator IG4 is connected by wires A and B to a control logic which corresponds to the unit shown in FIG. 1.

Figure 29:
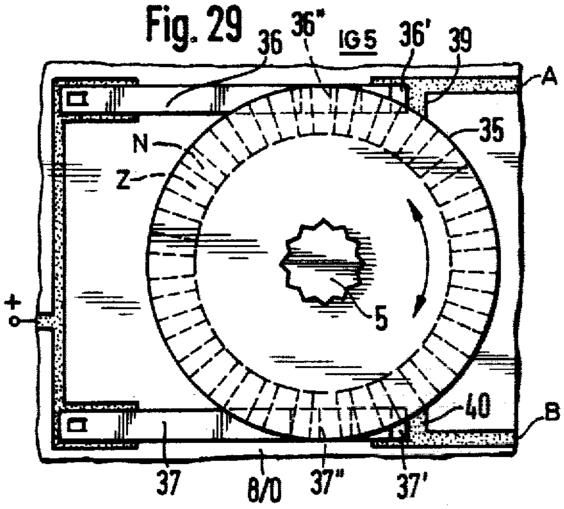
FIG. 29 is a schematic diagram of a fifth embodiment of a pulse generator.

Another pulse generator IG5, illustrated only partially in FIG. 29, is very similar to the pulse generator IG4 shown by FIG. 23, the difference being that the two spring contacts 36 and 37 are not placed side-by-side but are arranged such that they will engage opposite points of the cam plate. The counter-contacts are correspondingly offset at the supporting plate 8/0. The time-delayed diversion of the two spring contacts 36 and 37 upon the actuation of the pulse generator IG5 is identical with the occurrences depicted in FIGS. 25 to 27. However, the actual diversion is accomplished by two different cams N of the cam plate 35. Another difference is due to the fact that a turning knob is utilized as the control element 5.

Figure 30:
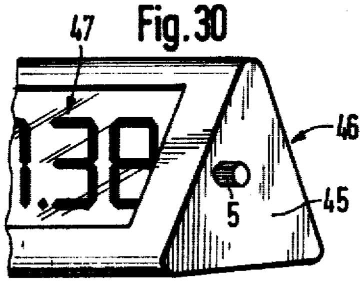
FIG. 30 shows the placement of the control unit of the pulse generator illustrated in FIG. 29 within an instrument with an electronic digital display.

FIG. 30 illustrates the arrangement of such turning knob to serve as control element of a pulse generator and arranged inside the casing 45 of an instrument 46 with electronic digital display 47.

A sixth species of a pulse generator, denoted by the symbol IG6, is depicted in FIG. 31. This pulse generator IG6 uses the same control logic 3 as the pulse generator IG1 (FIG. 1). It is also identical with the pulse generator IG5 in many respects. The cam plate 35 serves as a control element. The two spring contacts 36 and 37 are diverted radially toward the counter contacts 39 and 40 which are designed as leaf springs clamped down on one side and connected by wires A and B with the control logic 3. The two spring contacts 36 and 37 serve simultaneously as latching springs and engage with their outer ends 36' and 37', bent in V-shape, the cam track of the cam plate 35. They are offset relative to each other in direction of rotation so that the two pairs of contacts will close consecutively with a time delay when the pulse generator is actuated. FIGS. 32 and 33 depict one position each of the cam plate 35, turned in direction shown by the arrows for the generation of forward pulses. In FIG. 32 the first pair of contacts is closed and as pulse I1 is produced (see FIG. 36). In FIG. 33 the second pair of contacts is also closed and a pulse I2 is generated.

FIGS. 34 and 35 depict one position each of the cam plate turned in the direction shown by the arrows for the generation of backward pulses. FIG. 34 shows the first pairs of contacts closed, with a pulse I3 generated. In FIG. 35, the second pair of contacts is closed also and a pulse I4 is generated.

The pulses that are generated are plotted in the pulse diagram shown by FIG. 36 which is identical with the pulse diagram of FIG. 6. Therefore, there is no need for further evaluation of this pulse diagram which is shown here for reasons of clarity. Pulse generator IG6 can also be accomodated in a housing as illustrated in FIGS. 7 and 8 or 9 and 10 respectively and can further be equipped with the other components shown by these figures.

FIG. 37 depicts still another pulse generator, identified by symbol IG7. The stator 1 of this pulse generator IG7 comprises, like the stator of the pulse generator IG1, two groups of four contact surfaces each, 8/1 to 8/4 and 8/5 to 8/8, which are conductively connected with each other and which are arranged at the supporting plate 8/0 in two circular tracks concentric with the axle of rotation 6. The first group of contact surfaces 8/1 to 8/4 is arranged within an outer circular track and connected to a first input VRKE of the UP-DOWN counter 4. The control logic is integrated within this counter, an arrangement which differs from the previously shown solutions. The second group of contact surfaces 8/5 to 8/8 is arranged within an inner circular track and is connected by way of an electronic pulse former 48 to a second input of the UP-DOWN counter 4, which forms the counting pulse input ZE.

The two groups of contact surfaces are each arranged within their circular track inside a sector of approximately 150°, with the sectors overlapping at an end zone of approximately 60°. The contact surfaces 8/3 and 8/4 and 8/5, 8/6 respectively, which are located within this zone of overlap at the inner and the outer circular track are offset laterally relative to each other without overlap. There is also provided a contact plate 49 which is connected to the terminal of the voltge source and which is located in close proximity to the end of a sector delimiting the contact surfaces 8/0 to 8/4 as well as 8/5 to 8/8.

The rotor 2 of the pulse generator IG7 is formed by two contact rails 50 and 51 which are crossed at and fastened to the drive wheel 20 with different linear measurements in conformity with the diameters of the inner and the outer circular tracks of the contact surfaces and which rest jointly at the contact plate 49. The first contact rail 50 is rigidly fastened to the drive wheel 20. The second contact rail 51 is fastened to the wheel loosely to permit rotation, its rotation limited by tappets 53 which engage elongated holes 52 of the second contact rail 51. This rotational play allows the contact rails 50 and 51 to turn relative to each other during a change in the direction of rotation so that the two pairs of contacts, upon actuation of the pulse generator IG7 in a direction of rotation for the production of forward pulses, can be closed successively while the pulses do not overlap, and upon actuation of the pulse generator in a direction of rotation for the production of backward pulses, can be closed successively while the pulses overlap.

FIGS. 38 and 39 depict two positions of the rotor 2 which, for the purpose of producing backward pulses, has been turned from a latched position, as illustrated in FIG. 37, in a direction as indicated by the arrows. FIG. 38 shows that the first contact rail 50 has already turned by a certain angle while the second contact rail 51 is still at a position of rest. With the two contact rails in the position shown, both pairs of contacts are still open. In FIG. 39 both contact rails 50 and 51 have rotated, and the two pairs of contacts are closed. A counting pulse and a direction pulse are generated thereby and both are specified and plotted in the pulse diagram of FIG. 42.

Due to the simultaneous presence of a counting and a direction pulse, the control logic integrated in the UP-DOWN counter 4 will detect the backward direction of the counting pulse, indicated in FIG. 42 by the arrow. When the rotor 2 is turned further, the two pairs of contacts will open again in succession with time delay.

FIGS. 40 and 41 depict two positions of the rotor 2 which is turned from the latched position as shown in FIG. 37 for the production of forward pulses in the direction indicated by the arrows. FIG. 40 shows that here again the first contact rail 50 has turned by a certain angle while the second contact rail 51 is still in position of rest. With the contact rails in the position shown, both contact sections are still open. In FIG. 41, the first pair of contacts is closed by the contact rail 50 and a counting pulse is generated. Since, however, at this position of the contact rail 50, and even after the opening of the first pair of contacts, the second pair of contacts is not yet closed and a direction pulse is not generated, the control logic integrated in the UP-DOWN counter 4 will detect the forward direction for this counting pulse. Therefore, the closing of the second pair of contacts has no influence on the pulse generation in forward direction.

The pulses produced by any one of the above-described embodiments of the pulse generator emerge from the output terminal of the UP-DOWN counter 4 (as indicated by the arrow) in the form of switching, counting or regulating pulses or the like. They can form pulses which can be fed into an electronic circuit arrangement, for example, for the control of additional counting units or memory units, and can at the same time be displayed by way of the electronic digital indicators coupled with these units. However, these output pulses can also be used solely for the setting or the correction of a digital display. One possible field of application is the setting of the transmitter frequency for a radio, its value being taken from a schedule and its setting being followed visually by way of an electronic digital display serving as a monitor. Other possible applications are the day and alarm-time settings of clocks and watches, or the setting of a specified figure for any type of counting or recording devices.

Finally, it should be pointed out that the invention is not limited to the species illustrated and that other solutions within the framework of the invention are also feasible. This applies likewise to the above-mentioned possible fields of application of the invention.

What is claimed is:

1. An electro-mechanical pulse generator for producing electronic pulses for setting or correcting an electronic digital display, comprising:

a first assembly including several pulse-generating components which are arranged substantially at regular intervals within a circular track, concentric with an axle of rotation;

a second assembly, rotatable relative to said first assembly at variable speeds in a desired direction, including several sensing elements which cooperate with the pulse-generating components of said first assembly to actuate pairs of electrical contacts which are spaced relative to one another so that rotation of said first and second assemblies relative to one another causes at least two pairs of electrical contacts to be separately closed to directly produce at least two pulses which are displaced timewise, wherein the frequency of the pulses is proportional to the relative speed between said first and second assemblies and the phase shift of one pulse relative to another is dependent upon the direction of rotation of one of said assemblies relative to the other;

an UP-DOWN counter;

control logic for determining the phase shift between pulses and controlling the forward or backward actuation of said counter in response to the pulses; and a latching device coupled to said axle of rotation, said latching device maintaining all of said pairs of contacts open when the pulse generator is not actuated; and wherein said pulse-generating components of said first assembly and said sensing elements of said second assembly are angularly offset about said axle of rotation with respect to each other so that said at least two pulses which are directly produced by closure of said two pairs of electrical contacts upon actuation of the pulse generator will partially overlap in at least one direction of relative rotation of the assemblies.

2. An electro-mechanical pulse generator as defined in claim 1 wherein each of said at least two pairs of contacts is included in a switching section which further includes a portion of said control logic which is connected to an input terminal of said UP-DOWN counter.

3. An electro-mechanical pulse generator as defined in claim 3, wherein said switching sections are connected with a voltage source by their respective pair of contacts and a common wire.

4. An electro-mechanical pulse generator as defined in claim 3 wherein the control logic is used to determine phase shift and for the suppression of the bouncing effect of the pulses which can be produced upon the closing of the pairs of contacts, said control logic comprising two bistable flip-flop circuits which are logically interlinked with each other and are arranged within one switching section each.

5. An electro-mechanical pulse generator as defined in claim 5, wherein the two bistable flip-flop circuits are logically interlinked with each other by several gates and can be reset by the same.

6. An electro-mechanical pulse generator as defined in claim 5, wherein a reset contact is provided which co-acts with the pulse-generating components of the first assembly and which is connected to the reset inputs of the two bistable flip-flop circuits.

7. An electro-mechanical pulse generator as defined by claim 1, wherein the pulse-generating components of said first assembly are formed by contact surfaces arranged statically at an insulating supporting plate, and the sensing elements of said second assembly are formed by spring contacts which can be turned and which are connected to the axle of rotation.

8. An electro-mechanical pulse generator as defined in claim 1 wherein said first assembly comprises two groups of four contact surfaces each, the first group of contact surfaces being arranged within an outer circular track, and the second group of contact surfaces being arranged within an inner circular track, the contact surfaces of each group being conductively connected with each other as well as, by means of a common wire, with the control logic, wherein each of the contact surfaces of the first group is radially offset by approximately one third of one contact surface width relative to the contact surface of the second group of contact surfaces that is radially adjacent to it, and the two spring contacts of the second assembly are attached in the form of bent leaf springs to an electrically conductive central part which is connected with the drive of the pulse generator, the outer free ends of the two leaf springs being located at a straight line running through the center of the axle of rotation and engaging the two circular tracks of the contact surfaces, further wherein there are provided two additional spring contacts which are designed like the two other spring leafs and are molded to the central part at rotational symmetry being offset by 180° relative to the first-mentioned springs, and there is provided a contact plate, shaped in the form of a sector of an annulus and connected to one terminal of the voltage source, with the spring leaf pairs resting alternatively on said contact plate.

9. An electro-mechanical pulse generator as defined in claim 8, wherein said second assembly is formed from a single piece and is fastened to a drive wheel made of insulating material which is mounted at the axle of rotation and is equipped with a pinion and a click-stop serration to be engaged by a latching spring to define rotational steps.

10. An electro-mechanical pulse generator as defined in claim 8 wherein said first assembly comprises two groups of four contact surfaces each which are conductively connected with each other, with the first group of contact surfaces being arranged within an outer circular track and connected with a first input of an UP-DOWN counter into which said control logic is integrated;

said second group of contact surfaces being arranged within an inner circular track and connected with a second input of said UP-DOWN counter which forms a counting pulse input, each of the two groups of contact surfaces having a circular track that is located inside a sector of approximately 150°;

wherein these sectors overlap within an end zone of approximately 60° and the contact surfaces of the inner and the outer circular track located within this zone of overlap are offset laterally relative to each other without overlap;

said pulse generator including a contact plate which is connected with a terminal of the voltage source, said contact plate overlapping at a slight lateral distance from said contact surfaces the ends of the sector delimiting the contact surfaces, further including two contact rails crossed at, and fastened to a turnable drive wheel, said two contact rails having different linear measurements, each corresponding to the diameter of the inner or respectively outer circular track of the contact surfaces, and resting on the contact plate which is common to both;

said first contact rail being rigidly fastened to the drive plate and said second contact rail being attached loosely to the drive plate to permit rotation with respect thereto, this rotation being limited by tappets which engage elongated holes in said second contact rail, allowing the two contact rails to turn relative to each other at a change in direction of rotation so that said at least two pairs of contacts can be closed in succession independently of the actuating direction of the pulse generator, and, upon actuation of the pulse generator in one direction of rotation, there are produced pulses which do not overlap each other, and, upon actuation of the pulse generator in the other direction of rotation, pulses which overlap each other partially are produced.

11. An electro-mechanical pulse generator as defined in claim 1, wherein the pulse-generating components of said first assembly are formed by contact surfaces which are fixedly arranged at a supporting plate which insulates, turns and is connected with the axle of rotation of the pulse generator, and the sensing elements of said second assembly are formed by spring contacts which are statically fastened to a stationary support.

12. An electro-mechanical pulse generator as defined in claim 12 wherein the contact surfaces of said first assembly are molded radially to the outer side of an electrically conductive slip ring on which rests the outer free end of a contact spring which is connected to a terminal of the voltage source, and the two spring contacts of said second assembly are formed by leaf springs which are clamped down on one side, said leaf springs being placed parallel to each other and engaging with their outer free ends, spatially offset with respect to each other, the circular track of the surfaces of said first contact assembly so that the at least two pairs of contacts can be closed in succession.

13. An electro-mechanical pulse generator as defined in claim 13 further including a reset contact formed by a leaf spring which is clamped down on one side and which engages with its outer free end the circular track of the contact surfaces of the first assembly to reset two bistable flip-flop circuits of the control logic when the at least two pairs of contacts are open.

14. An electro-mechanical pulse generator as defined in claim 1 wherein the pulse-generating components of said first assembly are designed in the form of mechanical contact cams and are fastened to a cam plate which is connected to the axle of rotation of the pulse generator, and the sensing elements of the second assembly are formed by spring contacts which are arranged stationary at a supporting plate and which engage, spatially offset relative to each other, the cam track at various points of the cam plate such that two contacts can each be diverted in succession by a cam and pressed against counter-contacts which are connected to the control logic.

15. An electro-mechanical pulse generator as defined in claim 15 wherein the spring contacts are formed by leaf springs which are clamped on one side and connected with one terminal of the voltage source to function as latching springs, and which have V-shaped projections which extend into a gap between two adjacent cams, said spring contacts sliding eccentrically as well as in direction of rotation relative to each other.

16. An electro-mechanical pulse generator as defined in claim 1, wherein at least the mechanical parts of the pulse generator are arranged within a housing which is traversed by the axle of rotation, which is connected with the revolving components of one of said first assembly and second assembly by means of a transmission gear, and further including a bearing axle, for the support of said revolving components, which forms the theoretical axle of rotation for the revolving components of one of said first and second assemblies.

17. An electro-mechanical pulse generator for producing electronic pulses for setting or correcting an electronic digital display, comprising:

a first assembly including several pulse-generating components which are arranged substantially at regular intervals within a circular track, concentric with an axle of rotation;

a second assembly, rotatable relative to said first assembly at variable speeds in a desired direction, including several sensing elements which cooperate with the pulse-generating components of said first assembly to actuate pairs of electrical contacts which are spaced relative to one another so that rotation of said first and second assemblies relative to one another causes at least two pairs of electrical contacts to be separately closed to produce at least two pulses which are displaced timewise, wherein the frequency of the pulses is proportional to the relative speed between said first and second assemblies and the phase shift of one pulse relative to another is dependent upon the directiorr of rotation of one of said assemblies relative to the other;

an UP-DOWN counter; and control logic for determining the phase shift between pulses, for controlling the forward or backward actuation of said counter in response to the pulses, and for suppressing the bouncing effect of the pulses which can be produced upon the closing of the pairs of contacts, said control logic comprising two bistable flip-flop circuits which are logically inerlinked with each other so that an output signal from each flip-flop affects an input signal to the other flip-flop; wherein each of said at least two pairs of contacts is included in a switching section which further includes a portion of said control logic which is connected to an input terminal of said UP-DOWN counter; and wherein said two bistable flip-flop circuits are arranged within one switching section each.

18. An electro-mechanical pulse generator as defined in claim 17, wherein the two bistable flip-flop circuits are logically interlinked with each other by several gates and can be reset by the same.

* * * * *